United States Patent
Gallhauser et al.

(10) Patent No.: US 11,125,779 B2
(45) Date of Patent: Sep. 21, 2021

(54) PROBE WITH RADIO FREQUENCY POWER DETECTOR, TEST SYSTEM AND TEST METHOD

(71) Applicant: Rohde & Schwarz GmbH & Co. KG, Munich (DE)

(72) Inventors: Markus Gallhauser, Freising (DE); Werner Perndl, Zorneding (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 30 days.

(21) Appl. No.: 16/192,187

(22) Filed: Nov. 15, 2018

(65) Prior Publication Data

US 2020/0158755 A1    May 21, 2020

(51) Int. Cl.
*G01R 1/067* (2006.01)
*G01R 31/28* (2006.01)
*G01R 21/10* (2006.01)
*G01R 1/04* (2006.01)

(52) U.S. Cl.
CPC ....... *G01R 1/06772* (2013.01); *G01R 1/0416* (2013.01); *G01R 21/10* (2013.01); *G01R 31/2822* (2013.01)

(58) Field of Classification Search
CPC . G01R 1/06772; G01R 21/10; G01R 31/2822
See application file for complete search history.

(56) References Cited

U.S. PATENT DOCUMENTS

| | | | | |
|---|---|---|---|---|
| 5,376,888 A | * | 12/1994 | Hook | G01N 22/04 324/533 |
| 5,508,630 A | * | 4/1996 | Klemer | G01R 1/06772 324/754.06 |
| 7,323,890 B2 | | 1/2008 | Petersen et al. | |
| 7,924,025 B2 | * | 4/2011 | Eisenstadt | G01R 31/2884 324/601 |
| 9,599,657 B2 | * | 3/2017 | Ding | G01R 31/26 |
| 2001/0050565 A1 | | 12/2001 | Petersen et al. | |
| 2004/0056674 A1 | | 3/2004 | Petersen et al. | |
| 2006/0214679 A1 | | 9/2006 | Henson et al. | |
| 2008/0186036 A1 | * | 8/2008 | Shumaker | G01R 1/06772 324/754.01 |
| 2011/0163773 A1 | * | 7/2011 | Zelder | G01R 29/0878 324/754.21 |
| 2020/0049787 A1 | * | 2/2020 | Guisan | G01R 33/24 |

FOREIGN PATENT DOCUMENTS

| | | |
|---|---|---|
| EP | 974845 A1 | 1/2000 |
| WO | 2000003252 A3 | 4/2000 |

* cited by examiner

*Primary Examiner* — Lee E Rodak
(74) *Attorney, Agent, or Firm* — Westman, Champlin & Koehler, P.A.

(57) ABSTRACT

Probe for testing a radio frequency device, test system and test method. A probe is used for measuring radio frequency signals provided by the device under test or for providing test signals to the device under test. In particular, the probe comprises a power detector directly connected to the contacting elements of the probe. Accordingly, such a power detector can provide a power signal highly correlated with the power signal of a radio frequency signal at input or output terminals connected to the probe.

11 Claims, 3 Drawing Sheets

PROBE WITH RADIO FREQUENCY POWER DETECTOR, TEST SYSTEM AND TEST METHOD

TECHNICAL FIELD

The present invention relates to a probe, in particular a probe connectable to a device under test. The present invention further relates to a test system. Further, the present invention relates to a test method.

BACKGROUND

Although applicable in principle to any test system, the present invention and its underlying problem will be hereinafter described in combination with testing a radio frequency device on a wafer.

Radio frequency devices usually have to be tested in order to ensure reliability and high quality of the devices. Thus, during production of devices it is necessary to thoroughly test the devices by providing predetermined measurement signals and/or measuring radio frequency output signals of the devices.

For this purpose, the device under test may be connected with a measurement system by means of a probe. In order to achieve high quality measurements, it is desirable to measure the power provided to the device under test or output by the device under test with high accuracy. Thus, all related elements such as the measurement probe and the wires connected the probe with the measurement equipment have to be well characterized. Further, a complex calibration process has to be performed in order to obtain appropriate calibration parameters, and these calibration parameters have to be taken into account during the measurement procedure.

Since modern devices operate in more and more increasing frequency ranges, such calibration of the measurement equipment becomes a very complex and expensive process.

Against this background, a problem addressed by the present invention is to provide a reliable, precise and cost-efficient testing of radio frequency devices. In particular, the present invention aims to provide a probe, which can provide a precise power measurement of radio frequency signals without requiring a complex calibration.

SUMMARY

The present invention solves this object by a probe, a test system and a test method with the features of the independent claims. Further advantageous embodiments are subject-matter of the dependent claims.

According to a first aspect, a probe is provided. The probe is connectable to a device under test. The probe comprises a contacting means and a power detector. The contacting means is configured to contact directly a number of input and/or output terminals of the device under test. The power detector is configured to measure power of a radio frequency signal provided at the contacting means. In particular, the power detector is connected directly to the contacting means.

According to a further aspect, a test system for testing a device under test is provided. The test system comprises a probe and a measurement device. The probe is connectable to the device under test. The probe comprises contacting means for contacting directly a number of input and/or output terminals of the device under test. The probe further comprises a power detector for measuring power of the radio frequency signal provided at the contacting means. In particular, the power detector is connected directly to the contacting means. The measurement device is configured to receive the power of the radio frequency signal measured by the power detector. The measurement device is further configured to provide a radio frequency signal to the probe and/or to measure a radio frequency signal of the device under test captured by the probe. In particular, the provision of the radio frequency signal and/or the measuring of the radio frequency signal is performed by taking into account the power of the radio frequency signal measured by the power detector.

According to still a further aspect, a test method for testing a device under test is provided. The test method comprises contacting directly a number of input or output terminals of the device under test by contacting means. The test method further comprises measuring, by a power detector, power of a radio frequency signal provided at a said contacting means, wherein the power detector is connected directly to the contacting means.

The present invention is based on the fact that a precise knowledge of signal provided to a device under test and a precise knowledge of signals received from the device under test are essential for an accurate testing of the device under test. The present invention further takes into account that each element such as cables, connectors, etc. may introduce disturbances or at least may attenuate a signal. Thus, a complex calibration has to be applied in order to compensate the impact of the elements between the device under test and the measurement device. However, since modern devices may use higher and higher frequencies, the calibration of test systems for high frequencies becomes more and more complex.

It is therefore an idea of the present invention to take into account these observations and to provide a simple and reliable testing of radio frequency devices, in particular radio frequency devices operating at high frequencies, e.g. 5G devices. For this purpose, it is an idea of the present invention to connect the measurement system with the device under test by means of a probe, which comprises a power detector, wherein the power detector is directly connected with the probe. In other words, no further elements are arranged between the power detector and the probe for contacting the device under test with the measurement system. In this way, it is possible to avoid negative impact of further elements such as cables, connectors, etc. Thus, the power measured by such a power detector directly connected to the probe can provide a very precise and accurate measurement result without the need of complex calibration.

The contacting means may be any kind appropriate device, which is configured to establish a direct electrical contact to an input or output terminal of the device under test. For example, the contacting means may comprise a single contacting element, which can establish an electrical connection with a terminal of the device under test. In such a case, an output signal provided at such a terminal of the device under test may be measured against a predetermined potential, for example a ground potential. Additionally, or alternatively, it may be also possible to provide an input signal at the terminal of the device under test with respect to a predetermined potential. In both cases, the power detector may measure a power of the respective radio frequency signal, i.e. the radio frequency signal at the terminal of the device under test, which is in contact with the contacting element of the contacting means.

Furthermore, it may be also possible that the contacting means comprises a number of two or more contacting elements. In this case, each contacting element may be in contact with one of multiple terminals of the device under test. For example, it may be possible that a separate signal may be provided to each terminal of the device under test and/or a separate signal may be measured at each terminal of the device under test. Furthermore, it is understood that any combination of providing radio frequency signals to the device under test and receiving radio frequency signals from the device under test may be possible. It is also possible to provide a test signal as a differential signal between two contacting elements of the contacting means and apply this signal between two terminals of the device under test. Accordingly, it may be also possible to measure a signal between two terminals of the device under test by measuring a differential signal between two contacting elements, which are in contact to the respective output terminals of the device under test. Furthermore, any other combination for providing test signals to the device under test and/or measuring output signals of the device under test may be also possible.

The power detector may be any kind of appropriate device for measuring power of a radio frequency signal. As will be further discussed in more detail, the power detector may be, for example, a diode. However, any other kind of a power detector, for example a thermal power detector or the like, may be also possible. The power detector may measure an amplitude of a radio frequency signal. Accordingly, the power detector does not take into account a phase or a modulation of the respective radio frequency signal.

The power detector may measure a power of radio frequency signal with respect to a predetermined potential, for example a ground potential. Alternatively, it may be also possible that a power detector may measure a power of a differential signal between two contacting elements of the contacting means, i. e. a differential signal between two terminals of the device under test. The measured power, which is measured by the power detector may relate to a test signal which is provided to the device under test. Furthermore, the power which is measured by the power detector may also relate to a radio frequency signal which is output by the device under test. The measurement result of the power detector may be provided in any appropriate manner. For example, the power detector may provide an output signal which corresponds to the power measured by the power detector. For example, the output signal may be an analogue signal, which is provided to a further processing unit. In this case, the further processing unit may receive the output signal of the power detector in order to further process the output signal. For example, the further processing unit may convert an analogue signal to a digital signal or perform any other appropriate operations, for example an amplification, attenuation, filtering etc.

Depending on the application, the probe may comprise a number of one or even more power detectors. For example, a first power detector may be used for measuring a power of a test signal provided to the device under test, and a further power detector may be used for measuring a power of an output signal provided by the device under test. Furthermore, it may be also possible to use more than one power detectors for measuring multiple test signals provided to the device under test. Additionally, or alternatively, it may be also possible to use more than one power detector for measuring multiple output signals provided by the device under test.

By connecting the power detector directly to the contacting means, and a further directly contacting the contacting means to the terminals of the device under test, the power detector can measure the power of the respective radio frequency signals very precisely. In particular, attenuations or disturbances due to an impact of further elements such as connectors or cables can be avoided. In this way, a complex and coasty calibration for identifying and eliminating disturbances can be avoided. Hence, the measurement of the device under test can be simplified, and consequently, the testing of the device under test can be accelerated. In this way, the testing of the device under test by a probe having a power detector directly connected to the contacting means of the probe can achieve a faster and more precise measurement.

Further embodiments of the present invention are subject of the further sub-claims and of the following description, referring to the drawings.

In a possible embodiment, the power detector comprises a diode.

The diode may be a semiconducting element rectifying an alternating current of a radio frequency signal to be measured. Furthermore, the output of the rectified signal may have a quadratic characteristic curve. In this way, very simple power detector can be realized. By using a small sized diode, such a power detector can be easily arranged at a small size probe. In particular, due to the small size of a diode, it is possible to arrange such a power detector very close to the contacting means.

In a possible embodiment, the contacting means consist of homogeneous electrical conductive material. In particular, the contacting means may consist of a metal, for example a metal having only a low contact resistance.

In this way, a radio signal output by the device under test may be forward to the power detector without any significant disturbances. Furthermore, test signals provided to the device under test by the probe may be also provided to the device under test and simultaneously measured by the power detector without introducing significant disturbances or attenuations. By using a homogenous material, in particular a highly electrical conductive metal, the radio frequency signal measured by the power detector matches very well the radio frequency signal at the contact between the contact means and the terminals of the device under test.

In a possible embodiment, the contacting means comprises at least one of a radio frequency splitter, a radio frequency coupler or a radio frequency switch. Furthermore, another appropriate radio frequency device, which may be required in the signal path between the device under test and a measurement device may be also included in the contacting means.

In such a configuration when the contacting means comprises a further radio frequency device, the power detector may be arranged in a signal path between the further radio frequency device and the device under test or alternatively between the further radio frequency device and the measurement device. Accordingly, the power of the signal at the respective location may be measured by the power detector.

In a possible embodiment, the contacting means may comprise a number of contacting tips.

In particular, the contacting means may comprise a separate contacting tip for each terminal of the device under test, which shall be contacted. The contacting tips may comprise a highly conductive metal, for example gold, silver or the like. In this way, the conductive resistance between the terminal of the device under test and the probe, in particular the contacting tip of the contacting means can be reduced.

The shape of the contacting tips may be adapted in accordance with the corresponding terminals of the device under test.

In a possible embodiment, each conducting tip may be configured to contact directly with a terminal of a wafer.

By using appropriate conducting tips for conducting terminals of a wafer, the probe can easily measure small size devices under test, in particular devices on a wafer. In this way, a high efficient testing of individual devices on a wafer can be performed.

In a possible embodiment, the probe may further comprise a cable. The cable may be connected to the contacting means. In particular, the cable may be configured to connect electrically the contacting means with a measurement device. The measurement device may be, for example a network analyzer, a signal generator or a spectrum analyzer.

By providing a cable on the probe, it is possible to forward output signals of the device under test to the measurement device, and/or provide test signals from the measurement device to the device under test.

In a possible embodiment, the probe further comprises a processing unit. The processing unit may be connected to the power detector. In particular, the processing unit may be configured to receive an output signal of the power detector.

Accordingly, the processing unit may further process the output signal of the power detector in order to generate a measurement signal corresponding to the power at the position of the power detector. For example, the processing unit may comprise elements such as an analogue to digital converter, a filter, an amplifier or attenuator for adapting the signal provided by the power detector. Furthermore, the processing unit may comprise any other kind of elements for processing the signal of power detector in the analogue or digital domain. The processing unit may be realized, at least in part, by a microprocessor executing instructions stored in a memory associated with the processor. However, it is understood, that the processing unit may be also realized in any other appropriate manner.

In a possible embodiment, the processing unit is connected to the power detector via a measurement cable.

Accordingly, by connecting the power detector with the processing unit by a measurement cable, the processing unit may be located at a spatial distance from the power detector. In this way, a very flexible arrangement is possible. The processing unit may be further located in conjunction with the measurement device, a network analyzer, signal generator or spectrum analyzer. In particular, the measurement device and the processing unit may be realized by separate devices or alternatively by a common, single device. For example, the processing unit and the measurement device may be connected to the probe by a common cable. Accordingly, the signal provided by the power detector and the signals between the measurement device and the contacting means may be transmitted via the same cable. In particular, separate wires of the cable may be used for transmitting the signal of the power detector and the signals between the measurement device and the probe. Alternatively, it may be also possible to use a common wire for transmitting the signal from the power detector to the processing unit and the signals between the measurement device and the contacting means.

In a possible embodiment, the probe may further comprise a mechanical positioning structure. The mechanical positioning structure may be configured to move around the probe. In particular, the mechanical positioning structure may move around the probe on a two-dimensional plane. Accordingly, the probe may be moved such that the contacting means may contact the required terminals on the device under test. For example, a wafer may comprise multiple devices under test, and the mechanical positioning structure may move the probe successively from one device under test to the next device under test.

With the present invention is therefore not possible to measure a power of a radio frequency signal at the input or output terminals of a device under test. In particular, since the power detector for measuring the power of the respective radio frequency signal is located directly on the contacting means for electrically contacting the terminals of the device under test, disturbances and attenuations can be avoided, which may be introduced by cables or additional connectors. In this way, a power of a radio frequency signal can be measured very precisely without the need of a complex calibration or the like.

BRIEF DESCRIPTION OF THE DRAWINGS

For a more complete understanding of the present invention and advantages thereof, reference is now made to the following description in conjunction with the accompanying drawings. The invention is explained in more detail below using exemplary embodiments, which are specified in the schematic figures of the drawings, in which.

Figure 1:
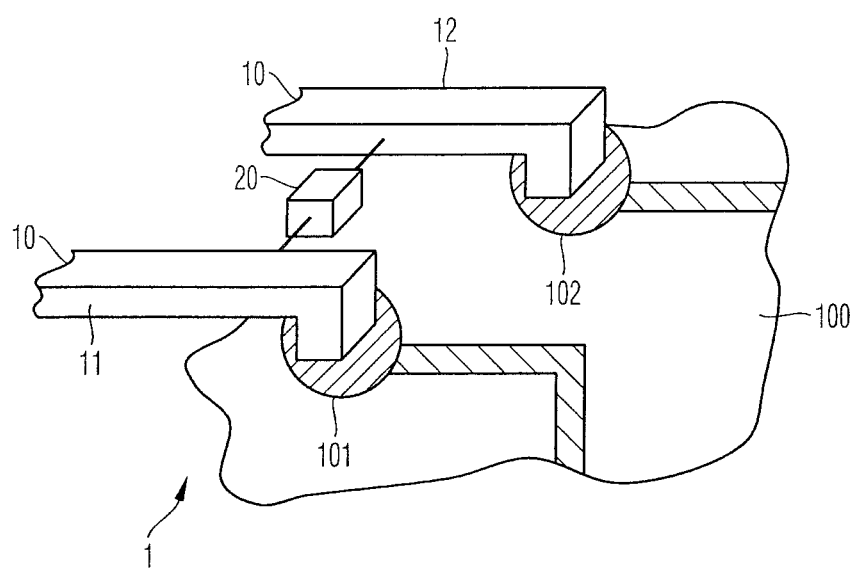
FIG. 1 shows a perspective view of an embodiment of a probe according to the present invention.

The appended drawings are intended to provide further understanding of the embodiments of the invention. They illustrate embodiments and, in conjunction with the description, help to explain principles and concepts of the invention. Also embodiments and may of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a perspective view of a probe 1. The probe 1 comprises a contacting means with a number of one or more contacting elements 11, 12. Even though in this embodiment two contacting elements 11, 12 are shown, the present invention is not limited to two contacting elements 11, 12. Moreover, any number of one or more contacting elements 11, 12 may be possible. Each contacting element 11, 12 may be configured to realize electric contact with a terminal 101, 102 of a device under test 100. The terminals 101 and 102 of the device under test 100 may be input terminals for receiving a signal, in particular a radio frequency signal or output terminals for providing a signal, in particular a radio frequency signal. Thus, when a contacting element 11, 12 is in contact with a terminal 101, 102 of the device under test 100, probe 1 may receive the respective output signal provided by the device under test 100. Alternatively, probe 1 may provide a test signal, in particular a radio frequency test signal, to the device under test 100 via the respective terminal 101, 102.

The device under test 100 may be any kind of test device, in particular any device dealing with radio frequency signals, e.g. a 5G device. For example, device under test 100 may be a small sized device on a wafer. For example, device under test 100 may be a radio frequency circuit on a silicon wafer. However, it is understood, that the present invention is not limited to such devices under test arranged on a silicon wafer. Moreover, any other kind of device under test, in particular any other small sized device under test dealing with radio frequency signals may be also possible.

Contacting means 10, in particular contacting elements 11, 12 may be realized by an electrical conductive material. For example, contacting means 10, in particular contacting elements 11, 12 may consist of a homogenous electrically conductive material. For example, the conductive material may be a metal. In order to further improve the conductive properties and in particular to reduce the transition resistance between the contacting means 10 and the terminals 101, 102 of the device under test 100, contacting means 10, in particular the tips, which are desired to get in contact with the terminals 101, 102 of the device under test 100 may be coated with a conductive material having a low contact resistance. For example, at least the tips of the contacting means 10 may be coated with gold, platinum or another appropriate metal or alloy.

The probe 1, in particular contacting means 10 may be further connected with a measurement device, such as a network analyzer, a spectrum analyzer or a signal generator. This will be described in more detail below.

Probe 1 further comprises a power detector 20. Power detector 20 may measure a radio frequency signal applied to contacting means 10. For example, power detector 20 may measure the power of a radio frequency signal between a contacting element 11, 12 and a potential such as a ground potential. Alternatively, power detector 20 may measure the power of radio frequency signal between two contacting elements 11, 12 of contacting means 10. For example, power detector 20 may be a diode for measuring the power of a radio frequency signal. However, it is understood that any other appropriate device for measuring the power of a radio frequency signal may be also possible.

Power detector 20 is directly connected to contacting means 10. In other words, no further elements such as cables or connectors are used for connecting power connector 20 to contacting means 10. For example, contact elements of power detector 20 may be soldered or welded to related parts of contacting means 10, for example to the contacting elements 11, 12 of contacting means 10. In this way, attenuations or disturbances due to connectors or cables can be avoided. Thus, power detector 20 may measure the power of a signal which is applied to contacting means 10. Since contacting means 10 is further directly connected to the input or output terminals 101, 102 of the device under test 100, power detector 20 can perform a very reliable measurement of the radio frequency power at the related terminals 101, 102 of device under test 100. Thus, the output signal provided by power detector may directly correspond to the power of the radio frequency signal provided at the respective input or output terminals 101, 102 of device under test 100. In this way, it is possible to obtain a very precise power measurement without the need of an extensive and time-consuming calibration in order to compensate disturbances or attenuations.

The output of power detector 20 may be further provided to a measurement device or a processing unit, which will be described in more detail below.

Figure 2:
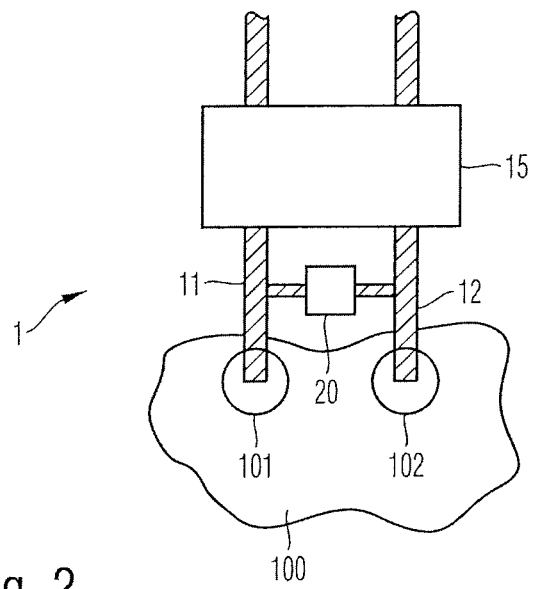
FIG. 2 shows a block diagram of another embodiment of a probe according to the present invention.

FIG. 2 shows a block diagram of a probe 1 according to a further embodiment. Probe 1 according to this embodiment mainly corresponds to the previously described probe. Thus, the explanation regarding to the probe described in connection with FIG. 1 also applies to the probe according to FIG. 2. Probe 1 according to FIG. 2 differs from probe 1 according to FIG. 1 in that contacting means 10 may further comprise an additional radio frequency circuit 15. For example, contacting means 10 may comprise a radio frequency coupler, a radio frequency splitter, a radio frequency switch, a filter, an attenuator or any other appropriate radio frequency device. The additional radio frequency device 15 may be connected electrically to contacting means 10 or may be part of contacting means 10.

In such a configuration, power detector 20 may be arranged in a signal path between the additional radio frequency device 15 and the tips of contacting means 10, which are connected to the terminals 101, 102 of the device under test 100. In this way, power detector may measure the radio frequency power at the terminals 101, 102 of the device under test 100. Losses caused by the additional radio frequency device 15 are not taken into account when measuring the power by power detector 20.

Alternatively, it may be also possible to arrange power detector 20 in a signal path between the additional radio frequency device 15 and the measurement device, in particular power detector 20 may be directly connected to the terminals of the additional radio frequency device 15, which are connected to the measurement device, e.g. by a cable. In this way, it is possible to measure the power at the respective terminals of the additional radio frequency device 15.

Figure 3:
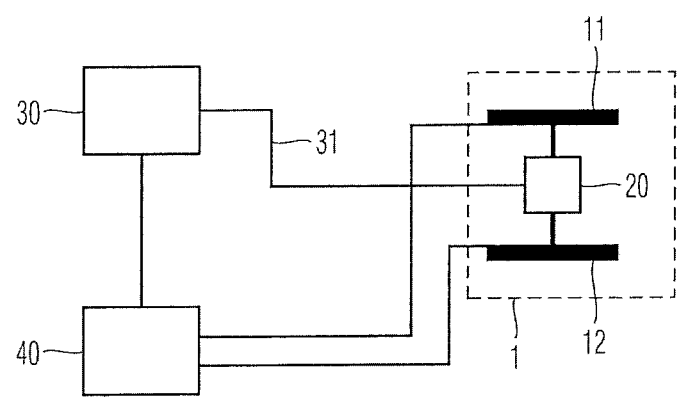
FIG. 3 shows a block diagram of an embodiment of a test system according to the present invention.

FIG. 3 shows a block diagram of a test system for testing a device under test 100. The test system may comprise a probe 1 as described above in connection with FIG. 1 or FIG. 2. The test system may further comprise a processing unit 30 connected to power detector and/or a measurement device 40 connected to probe 1.

Power detector 20 may provide an output signal to processing unit 30 and processing unit may further analyze the output signal provided by power detector 20. For example, processing unit 30 may convert an analogue output signal of power detector 20 to a digital signal and perform a further processing in a digital domain. Processing unit 30 may also comprise additional components such as an attenuator, an amplifier, a filter or any other appropriate elements. The processing result of processing unit 30 may be taken into account when evaluating the measurement results of a device under test 100 or for controlling the generation of test signals provided to device under test 100. Processing unit 30 may be connected to power detector 20 by a measurement cable 31. Accordingly, processing unit may be located at a spatial position, which is different from the spatial position of probe 1.

The test system may further comprise a measurement device 40, for example a network analyzer, a spectrum analyzer or a signal generator. However, it is understood that the present invention is not limited to these types of measurement devices. Measurement device 40 may be connected to contacting means 10 by means of an appropriate connection, for example a wired connection. Accordingly, measurement device 40 may generate one or more test signals and provide the test signals to the device under test 100 via contacting means of probe 1. At the same time, power detector 20 may measure the power of the radio frequency test signals provided to device under test 100. Signal generator 40 may control at least some parameters based on the power measurement performed by power detector 20. For example, a signal strength may be adapted based on the power measurement of power detector 20.

Furthermore, measurement device 40 may also receive radio frequency signals, which are forwarded from the terminals 101, 102 of the device under test 100 via the contacting means 10 of probe 1 to measurement device 40. Since the signal strength may be attenuated due to losses in the signal line between probe 1 and measurement device 40, measurement device 40 may take into account the power measurement of power detector 20. Accordingly, the measurement results may be adapted based on the power measurement of power detector 20. For this purpose, processing unit 30 may provide an appropriate processing result to measurement device 40 and measurement device 40 may adapt the measurement results based on the diode are provided by processing unit 30.

Even though, processing unit 30 and measurement device 40 are shown as separate devices, it may be also possible to integrate processing unit 30 in measurement device 40. Alternatively, it may be even possible that the processing of the signal provided by power detector may be also processed by measurement device 40. In particular, it may be possible to provide the measurement signal of power detector 20 and the signals between measurement device 40 and probe 1 by means of a common cable, in particular a cable having multiple wires.

In order to realize a precise positioning of contacting means 10, in particular of the contacting elements 11, 12 of contacting means 10 on the related input or output terminals 101, 102 of the device under test 100, a mechanical positioning structure (not shown) may be used. For example, the mechanical positioning structure may move around probe 1 with contacting means 10 and power detector 20. In particular, the probe 1 may be moved on a two-dimensional plane. Furthermore, the contacting means 10 may be lifted or lowered by means of the mechanical positioning structure. However, it is understood, that any other appropriate scheme for moving around the probe 1 may be also possible.

Figure 4:
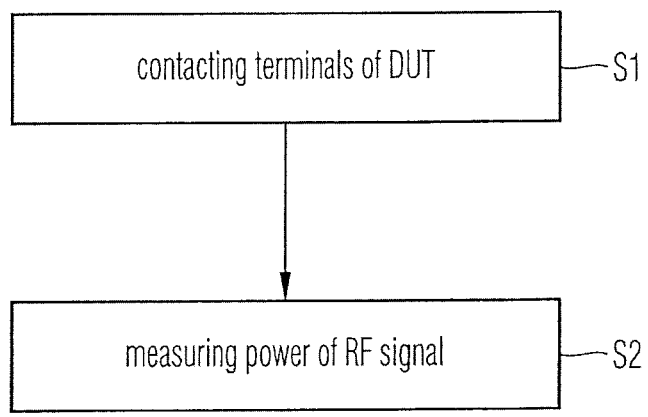
FIG. 4 shows a block diagram of an embodiment of a test method according to the present invention.

FIG. 4 shows a block diagram illustrating a test method according to an embodiment. In step S1 a number of input or output terminals 101, 102 of a device under test 100 are directly contacted electrically by a contacting means 10. In step S2, power of a radio frequency signal provided at the contacting means 10 is measured by a power detector 20. The power detector 20 is directly connected electrically to the contacting means 10.

Furthermore, any appropriate operation as described above in connection with FIG. 1 to FIG. 3 may be also applied by the test method.

Summarizing, the present invention relates to a probe for testing a radio frequency device, a test system and a test method. An enhanced probe is used for measuring radio frequency signals provided by the device under test or for providing test signals to the device under test. In particular, the probe comprises a power detector directly connected to the contacting elements of the probe. Accordingly, such a power detector can provide a power signal highly correlated with the power signal of a radio frequency signal at input or output terminals connected to the probe.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

The invention claimed is:

1. A probe connectable to a device under test, comprising:
a contacting means for contacting directly a number of input or output terminals of the device under test;
a power detector for measuring power of a radio frequency signal provided at said contacting means, wherein the power detector comprises a diode and two terminals of the power detector are connected directly to tips of said contacting means respectively, and no further elements are arranged between each of the two terminals of the power detector and the tips of the contacting means;
a processing unit connected to said power detector, wherein said processing unit is configured to receive an output signal of said power detector, and said processing unit is connected to said power detector via a measurement cable; and
a cable connected to said contacting means, the cable being configured to connect electrically said contacting means with a measurement device;
wherein said processing device is configured to provide a result of a power measurement to the measurement device.

2. The probe of claim 1, wherein the contacting means consists of a homogeneous electrically conductive material.

3. The probe of claim 1, wherein the probe comprises an additional radio frequency circuit including at least one of a radio frequency splitter, a radio frequency coupler or a radio frequency switch, wherein the power detector is arranged in a signal path between the additional radio frequency circuit and the tips of the contacting means.

4. The probe of claim 1, wherein the contacting means comprises a number of contacting tips.

5. The probe of claim 4, wherein each contacting tip is configured to contact directly with a terminal of a wafer.

6. A test system for testing a device under test, the test system comprising:
   a probe connectable to the device under test, the probe comprises a contacting means for contacting directly a number of input or output terminals of the device under test, and a power detector for measuring power of a radio frequency signal provided at said contacting means, wherein the power detector comprises a diode and the power detector is connected directly to said contacting means and no further elements are arranged between the power detector and the contacting means; and
   a processing unit connected to said power detector, wherein said processing unit is configured to receive an output signal of said power detector, and said processing unit is connected to said power detector via a measurement cable,
   a measurement device for measuring a radio frequency signal of the device under test captured by said probe taking into account the power of the radio frequency signal measured by said power detector;
   a cable connected to said contacting means, the cable being configured to connect electrically said contacting means with a measurement device;
   wherein said processing device is configured to provide a result of a power measurement to said measurement device.

7. A test method for testing a device under test, comprising:
   contacting directly a number of input or output terminals of the device under test by contacting means;
   connecting electrically said contacting means with a measurement device by a cable;
   measuring, by a power detector, power of a radio frequency signal provided at said contacting means, wherein the power detector comprises a diode and two terminals of the power detector are connected directly to tips of said contacting means and no further elements are arranged between each of the two terminals of the power detector and the tips of the contacting means; and
   processing an output signal of said power detector by a processing unit connected to said power detector, wherein said processing unit is connected to said power detector via a measurement cable,
   wherein said processing device is configured to provide a result of a power measurement to the measurement device.

8. The method of claim 7, wherein the contacting means consists of a homogeneous electrically conductive material.

9. The method of claim 7, providing an additional radio frequency circuit, and arranging the power detector in a signal path between the additional radio frequency circuit and tips of the contacting means,
   wherein the additional radio frequency circuit comprises at least one of a radio frequency splitter, a radio frequency coupler or a radio frequency switch.

10. The method of claim 7, wherein the contacting comprises contacting the input or output terminals of the device under test by a number of contacting tips.

11. The method of claim 10, comprising contacting each contacting tip directly with a terminal of a wafer.

* * * * *